US012578403B2

(12) United States Patent
Höcht et al.

(10) Patent No.: US 12,578,403 B2
(45) Date of Patent: Mar. 17, 2026

(54) COMMUNICATION IN A MAGNETIC RESONANCE IMAGING SYSTEM

(71) Applicant: Siemens Healthineers AG, Forchheim (DE)

(72) Inventors: Philipp Höcht, Bavaria (DE); Gilbert Yammine, Erlangen (DE); Felix Wolf, Bubenreuth (DE); Dieter Faust, Erlangen (DE); Jens Gühring, Erlangen (DE); Stefan Schönwälder, Herzogenaurach (DE)

(73) Assignee: Siemens Healthineers AG, Forchheim (DE)

( * ) Notice: Subject to any disclaimer, the term of this patent is extended or adjusted under 35 U.S.C. 154(b) by 363 days.

(21) Appl. No.: 18/203,691

(22) Filed: May 31, 2023

(65) Prior Publication Data

US 2023/0384406 A1     Nov. 30, 2023

Related U.S. Application Data

(60) Provisional application No. 63/347,251, filed on May 31, 2022.

(51) Int. Cl.
G01R 33/36        (2006.01)
G01R 33/54        (2006.01)

(52) U.S. Cl.
CPC ....... G01R 33/3692 (2013.01); G01R 33/546 (2013.01)

(58) Field of Classification Search
CPC ......................... G01R 33/3692; G01R 33/546
See application file for complete search history.

(56) References Cited

U.S. PATENT DOCUMENTS

| | | | |
|---|---|---|---|
| 7,746,072 B2 * | 6/2010 | Van Helvoort | .... G01R 33/3415 |
| | | | 324/309 |
| 8,214,012 B2 * | 7/2012 | Zuccolotto | ........... G01R 33/283 |
| | | | 324/306 |
| 2014/0275970 A1 | 9/2014 | Brown et al. | |
| 2015/0200996 A1 * | 7/2015 | Ziarati | ................ H04L 12/2838 |
| | | | 709/201 |
| 2016/0142383 A1 * | 5/2016 | Asano | ................... H04L 9/3265 |
| | | | 713/168 |
| 2017/0235342 A1 | 8/2017 | Brown et al. | |
| 2020/0169315 A1 | 5/2020 | Anderson et al. | |
| 2021/0123995 A1 | 4/2021 | Paul | |

* cited by examiner

*Primary Examiner* — Gregory H Curran
(74) *Attorney, Agent, or Firm* — Banner & Witcoff, Ltd.

(57)                ABSTRACT

A magnetic resonance imaging (MRI) system includes an internet protocol (IP) communication system for communicating IP-based communication data, an audio/video output, and an audio/video source. The MRI system also includes an audio/video/IP gateway device with multiple non-IP interfaces operable to receive and output audio/video data. The non-IP interfaces use non-IP protocols, while an IP interface connected to the communication system uses a predefined audio/video IP protocol. A controller is operable to convert received audio/video data between the non-IP and IP protocols, output converted audio/video data via the IP interface in IP protocol, and output converted audio/video data via the non-IP interfaces using the corresponding non-IP protocol.

15 Claims, 3 Drawing Sheets

S1
Receiving at least one AV data element by AV/IP gateway device via at least one of the interfaces.

S2
Converting the at least one AV data element to another non-IP-based protocol or the predefined AV IP-based protocol.

S3
Outputting the resulting AV data element via at least one of the corresponding interfaces.

| S1<br>Receiving at least one AV data element by AV/IP gateway device via at least one of the interfaces. |
| --- |
| S2<br>Converting the at least one AV data element to another non-IP-based protocol or the predefined AV IP-based protocol. |
| S3<br>Outputting the resulting AV data element via at least one of the corresponding interfaces. |

COMMUNICATION IN A MAGNETIC RESONANCE IMAGING SYSTEM

TECHNICAL FIELD

The disclosed subject matter concerns a magnetic resonance imaging system, comprising: at least one internet protocol communication system for communicating internet protocol-based communication data in the magnetic resonance imaging system, at least one output means for audio and/or video data, and at least one source means for audio and/or video data. Furthermore, the disclosed subject matter concerns a method for communicating in such a magnetic resonance imaging system.

BACKGROUND

Magnetic resonance imaging has become a widely used tool in health care, in particular diagnosis. Here, the spins of a patient are subjected to a strong main magnetic field in a, usually cylindrical, bore of the magnetic resonance imaging device. The aligned spins may then be excited by a radio frequency excitation pulse and the decay of this excitation may be measured as the magnetic resonance signal. Due to high field strengths and high requirements regarding homogeneity, the cylindrical patient bores usually have a small diameter in the order of tens of centimeters, such that the patient is transported into the bore lying on a patient table. Since magnetic resonance imaging procedures usually take some time, an examination duration of several tens of minutes is quite common. Hence, due to the patient being positioned lying in a confined space for a considerable amount of time, it is desirable to be able to communicate with the patient and/or provide distraction to the patient, for example by providing multimedia entertainment.

Communicating audio and/or video data into the bore of a magnetic resonance imaging device is a challenge due to confined space and requirements not to interfere with the measurement. For example, it was proposed to work with pressure waves or sound waves to transport information and/or audio signals from and/or to the patient. In newer approaches, radio frequency communication on frequencies, which are higher than the magnetic resonance frequency, has also been proposed.

For example, in US 2020/0169315 A1, systems and devices for wireless communication through an electromagnetically shielded window are proposed, wherein the magnetic resonance imaging device is positioned inside an electromagnetic shielding enclosure having such a window, through which radio frequency communication takes place. In particular, a wireless transmission of communication signals occurs through an RF attenuating window. The communication signals are exchanged via an RF frequency band that is above a working frequency of the magnetic resonance imaging device.

Solutions for entertaining a patient inside a bore of a magnetic resonance imaging device using audio and video data have been proposed on such a basis, for example providing a personalized patient display addressed wirelessly at one frequency and a pillow with integrated audio output means, which is addressed on a second, different frequency. The audio and/or video data is sent from a dedicated console unit to a wireless gateway, which sends the signals through the window into the RF electromagnetic shielding enclosure.

On the other hand, known magnetic resonance devices often comprise multiple components, for example, a control arrangement and/or in an operating room, which require inter-component communication. Here, communication systems based on the internet protocol (IP), that is, IP communication systems, have already been proposed. The internet protocol (IP) is a network layer communications protocol having a routing function enabling internetworking. In particular, a local area network (LAN) may be connecting the components. The LAN may be implemented using physical lines (ethernet cables) and/or wireless communication (WIFI). Often, such IP communication systems comprise at least one switch.

In magnetic resonance imaging systems, additional source means and output means for audio and/or video data may be provided, such as, for example, cameras for monitoring the patient, display means for displaying workflow information to the patient, optical and/or acoustical output means in an operating room, for example, displays, loudspeakers, and the like. These means usually work on their own, while some means may use the IP communication system. However, mostly, they are largely independent of each other and may even be provided by separate manufacturers, in particular regarding entertainment systems for the patient. Hence, in other words, in many cases third-party video and/or audio equipment is provided additionally in magnetic resonance imaging systems, providing no means to exploit possible synergies regarding patient communication and/or communication to remote personnel, for example, experts.

SUMMARY

It is an object of the current disclosure to provide simply implementable means allowing synergistic use of audio and/or video systems and/or other resources in a magnetic resonance imaging system, in particular regarding communication to and/or from a patient.

According to the subject matter of the disclosure, a magnetic resonance imaging system as initially described further comprises an audio and/or video/internet protocol gateway device (AV/IP gateway device), wherein the audio and/or video/internet protocol gateway device comprises multiple non-internet protocol interfaces for receiving audio and/or video data from source means and/or outputting audio and/or video data to output means, wherein the non-internet protocol interfaces use at least one audio and/or video non-internet protocol-based protocol, at least one Internet protocol interface connected to the Internet protocol communication system, the Internet protocol interface using a predefined audio and/or video Internet protocol-based protocol, and a control unit for converting received audio and/or video data elements between the at least one non-internet protocol-based protocol and the Internet protocol-based protocol, outputting audio and/or video data elements converted to the Internet protocol-based protocol via the Internet protocol interface, and outputting audio and/or video data elements converted from the Internet protocol-based protocol or another non-Internet protocol-based protocol via at least one of the non-Internet protocol interfaces using the non-Internet protocol-based protocol the audio and/or video data element was converted to.

In the following, to improve readability and understanding, "audio and/or video" will be abbreviated as AV, while "Internet protocol" will be abbreviated as IP. Hence, in short, an AV/IP gateway device is proposed having multiple non-IP interfaces and at least one IP interface connected to the IP communication system, such that AV data from multiple sources and standards may be converted to the predefined AV IP-based protocol of the communication system and vice versa, such that the AV/IP gateway device may be understood as a central distribution agent between the various source means and output means in the magnetic resonance imaging system, in particular allowing the use of the IP-based communication system for AV data elements. It is, in particular, noted that, in some embodiments, multiple AV/IP gateways may be provided, in particular at different locations, for example in different rooms, of the magnetic resonance imaging system.

Audio and/or video data is to be understood as a wide definition. While it may comprise audio and/or video data in at least one specific audio and/or video format, also information to be displayed or acoustically output may be understood as audio and/or video data, for example, provided as information data elements, in the scope of this disclosure. Generally speaking, at least one of the source means and output means may also be integrated and/or combined, resulting in a source and output means. In other words, each source means may also be an output means and each output means may also be a source means.

In common embodiments, the magnetic resonance imaging system may comprise components in different locations, in particular different rooms. For example, the magnetic resonance imaging system may comprise a magnetic resonance imaging device in an examination room, which is usually an electromagnetically shielded room (electromagnetic shielding enclosure). The magnetic resonance imaging device may comprise a main magnet unit comprising the, in particular superconducting, main field magnet and defining an, in particular cylindrical, bore, in which a patient is placed for examination, in particular on a patient table. The main magnet unit may also comprise a gradient coil arrangement and at least one radio frequency coil arrangement for magnetic resonance imaging. Furthermore, the magnetic resonance imaging system may comprise an operator room, in which, for example, operating consoles, monitoring equipment, and the like may be provided. Operation of the magnetic resonance imaging system may be controlled by a control arrangement, which may, at least partly, be provided in an equipment room. For example, the control arrangement may comprise multiple control devices, in particular, computing devices having at least one processor and storage means, located in the equipment room. For example, such control devices may comprise a host computer providing user interfaces and control, a low-level measurement computer, and/or a support computer providing assistance and/or support functions. Of course, architectures of the control arrangement may also be provided. Many of those components, in particular the components of the control arrangement, operating consoles, monitoring devices, and the like, may be connected by the IP communication system, which may, generally, comprise at least one switch.

Here, the disclosure mainly relates to communicating audio and/or video data between the different locations, in particular rooms. In particular, communication to a patient in the bore may be provided, wherein the AV/IP gateway device is preferably located in the operating room. Generally speaking, the AV/IP gateway device is configured to transfer AV data elements from any receiving IP or non-IP interface of the gateway device to any at least one other IP or non-IP interface of the AV/IP gateway device, allowing high flexibility and providing, in particular, at least one central location to distribute and, preferably, also combine AV data in the magnetic resonance imaging system, taking into account the particular requirements of a magnetic resonance imaging device, in particular having components being distributed over multiple rooms, wherein one of these rooms is even electromagnetically shielded and poses certain restrictions regarding space.

Here, it is noted that AV IP-based protocols have already been proposed in the art, such that AV source means and/or AV output means are available, which comprise interfaces configured to use these AV IP-based protocols. Such source means and output means can be directly connected to the IP communication network. In particular, at least one of the at least one source means and/or at least one of the at least one output means located remotely from the AV/IP gateway device may comprise such an interface configured to use the predefined AV IP-based protocol and be connected to the IP communication system. In particular, at least a part of such IP-based communication-enabled source means and/or output means may be provided in a room different from the room of the AV/IP gateway device.

In concrete, preferred embodiments, the predefined AV IP-based protocol may comprise or be an ONVIF protocol. ONVIF (open network video interface forum) creates a standard for communication between AV products using IP. While, originally, the standard was mainly addressing network video products, ONVIF protocols have been expanded to other areas of application, in particular also audio data.

In an especially preferred embodiment, the control unit may additionally be configured to combine AV data elements received by different interfaces of the AV/IP gateway device into one combined AV data element to be output via at least one of the interfaces of the AV/IP gateway device. By combining audio and/or video data from different sources, synergies may be exploited and/or generated. For example, by a combination of two video signals, picture-in-picture representations, in particular, videos, may be generated. Combining may further comprise adding information overlays to pictures and/or videos and/or otherwise combining video information. For example, workflow information or information regarding an ongoing magnetic resonance imaging examination may be added to entertainment information output to a patient in the bore, hence combining these audio and/or video systems. Resources, for example, output means like displays, may be used for multiple purposes simultaneously, providing increased benefit. Of course, combining may also comprise adding at least one audio data element to video data elements, for example, to provide an audio track. Many use cases are conceivable, some of which will be discussed regarding concrete embodiments below.

In less preferred embodiments, combining may also be performed elsewhere. For example, the magnetic resonance imaging system may further comprise at least one processing device configured to combine AV data elements received via the IP communication system. In particular, the processing device may be or comprise a network interface card (NIC), for example, a so-called third NIC. For example, one network interface may be provided internally, a second one may be provided to the user of the magnetic resonance imaging system, and a third network interface may be provided for third parties. If, in particular, AV data is introduced into the magnetic resonance imaging system via such a network interface card, at this network interface card, combinations may already be effected.

It may also be conceivable that such a network interface card at least partly replaces and/or implements the functionality of the AV/IP gateway device. For example, the third NIC (network interface card) interface can be designed in the operating room as a universal interface, for example as an HDMI interface. This allows a user or third-party device to be connected directly to the third NIC interface to provide audio data and/or video data. In addition, further information, for example from the system or to the system, can be transmitted via the third NIC interface.

As already mentioned, the magnetic resonance imaging system may further comprise a control arrangement. Here, preferably, the AV/IP gateway device and/or the processing device may be configured to combine an information data element from the control arrangement with at least one entertainment data element. The information data element may contain information regarding a current examination process, for example, a remaining examination time, and/or workflow information. For example, in an entertainment video, the patient is watching in the bore, additionally, a timer can be included as an overlay, indicating the remaining magnetic resonance imaging examination time.

In another concrete, advantageous embodiment, workflow information may be combined with entertainment information, for example comprising optical or acoustic instructions to the patient in the bore, which may be overlaid or included in an entertainment video and/or audio stream. An example of such an instruction is a breath-hold command, which may be supplemented by information regarding the expected duration and the like.

Preferably, the non-IP interfaces may at least partly be chosen from the group comprising a USB interface, an HDMI interface, a stereo audio line in and/or out interface, and at least one non-IP interface using a proprietary protocol.

As can be seen, standard interfaces may be provided, in particular also in multiplicate. In embodiments, some non-IP interfaces may be dedicatedly provided as input interfaces or output interfaces, in particular regarding HDMI interfaces and audio lines. However, non-IP interfaces may also be combined input and output interfaces, for example in the case of USB. In concrete embodiments, an AV/IP gateway device may comprise three USB interfaces, two HDMI input interfaces, two HDMI output interfaces, one audio line in interface, and one audio line out interface, as standard interfaces. Of course, also proprietary interfaces can be additionally or alternatively provided. For example, some known magnetic resonance imaging systems already provide proprietary intercom communication, which may also be included in the central distribution and, in particular, also combination possibility provided by the AV/IP interface.

In particular regarding the USB interface, USB mass storage devices, for example, USB sticks, may be connected to introduce respective AV data into the magnetic resonance imaging system. For example, a user or even a patient may bring his own audio and/or video files for entertainment during the magnetic resonance imaging examination. In addition to mass storage devices, also other source means may be connected using such a standard interface, in particular USB interface. For example, a source means can also be a connector to a streaming service, for example, a Fire TV stick, a connector to Apple TV, and the like.

In preferred embodiments, the magnetic resonance imaging system may further comprise at least one computing device, to which the AV/IP gateway device is connected via at least one of its non-IP interfaces, in particular a USB interface, wherein the gateway device is configured to identify itself as a multimedia peripheral to the computing device, in particular as a sound card and/or a webcam. In other words, the AV/IP gateway device may act as a peripheral, in particular a sound card and/or a webcam providing AV data. Such addressability may simplify the usage of the AV data provided by the AV/IP gateway device. For example, if the AV/IP gateway device is identified as a webcam, the AV data may be directly used in a video conference. For example, if an external, remote expert is included for a magnetic resonance imaging examination, the AV data sent to the computing device may include monitoring data, video streams from cameras in the examination room, and/or even audio data from the patient themselves. Here, in the course of such a video conference, even communication with the patient may be enabled, for example, communication between the remote expert and the patient. An additional participant in such a video conference may be the operator of the magnetic resonance imaging system, for example using a console in the operator room. Hence, the inclusion of remote experts is simplified and improved by, in particular, providing monitoring information and the option to communicate with the patient. It is noted that such inclusion, in particular, forwarding of monitoring AV information and/or allowing communication with the patient can also be implemented using other means besides the identification of the AV/IP gateway device as a peripheral.

In a concrete, advantageous embodiment, the magnetic resonance imaging system may comprise, at least partly in a shielded examination room, a magnetic resonance imaging device, and at least one first output means for AV data and/or at least one first source means for AV data, and, in an operator room, at least one second output means for AV data and/or at least one second source means for AV data, wherein the AV/IP gateway device is located in the operating room.

In the operator room, the interfaces, in particular the non-IP interfaces, of the gateway device can be easily accessed, for example, to connect temporary source means, like mass storage devices, and/or output means, like additional displays or the like. Since the operator of the magnetic resonance imaging system is usually in the operator room, this person can accordingly connect or disconnect means and devices. To transport AV data to the examination room, preferably, at least partly the IP communication system is used, enabled by the AV/IP gateway device.

In other words, at least one of the at least one first output and/or source means may be connected to the IP communication system via interfaces using the predefined AV IP-based protocol. For example, such a first source means may be a camera in the examination room, which is adapted to communicate using the ONVIF protocol. In such embodiments, additional conversion may not be necessary, at least for the respectively configured first output and/or source means.

Preferably, the at least one first output and/or source means may comprise a patient infotainment system, the patient infotainment system comprising at least one display and/or at least one headphone and/or at least one loudspeaker and/or at least one microphone. Such patient infotainment systems have already been proposed and may, for example, provide a so-called personalized patient display and/or at least one pillow, which may comprise headphones and/or at least one loudspeaker and/or at least one microphone. In embodiments, headphones may also be included in a personalized patient display unit. Such a patient infotainment system may, for example, be a third-party system that may be easily integrated into the magnetic resonance imaging system by providing the AV/IP gateway device.

In this context, in preferred embodiments, the patient infotainment system may further comprise a wireless communication system having at least one transceiver located outside of the examination room and being connected to the internet protocol communication system via an interface using the predefined AV IP-based protocol. Here, for example, wireless radio frequency communication to different components of the patient infotainment system in the examination room may use different frequencies. For example, a system as described in the already-cited US 2020/0169315 A1 may be used, wherein the transceiver may, for example, be located adjacent to an RF-attenuated window of the examination room. Generally speaking, in such embodiments, it is proposed to configure the transceiver as a wireless IP gateway, which receives AV data via the IP communication system and wirelessly transmits it to further components of the patient infotainment system, and receives AV data from further components of the patient infotainment system and further transmits it into the IP communication system.

In other words, audio data and/or video data may be generated and/or provided in the AV/IP gateway device available for audio output and/or video output to the patient. An exchange of audio data and/or video data from the AV/IP gateway device with the wireless IP gateway, that is, the transceiver, can take place via a proprietary interface and/or a standard interface, such as an ONVIF (open network video interface forum) protocol.

From the wireless IP gateway, that is, the receiver, audio data and/or video data are exchanged via a proprietary wireless interface to the examination room. The antenna for the transmission of the audio data and the antenna for the transmission of video data can be combined, for example by means of a diplexer. In the examination room, the audio data and the video data can be separated again via another diplexer. In this manner, a device for transmitting audio data and/or video data into the bore of a magnetic resonance imaging device may be provided.

It is noted that further components of the patient infotainment system, in particular, AV source means, may be provided in the operator room connected to the AV/IP gateway device via at least one of its non-IP interfaces. Hence, known completely separate patient infotainment systems may be modified by using the AV/IP gateway device and the IP communication system of the magnetic resonance imaging system to provide further integration, efficiency, and synergy options. In particular, information data elements, for example relating to a current magnetic resonance imaging examination and/or workflow information, can be combined with entertainment information, as discussed above, allowing to use a patient infotainment system also for workflow tasks and examination information tasks.

On the other hand, there is also the option of displaying entertainment data elements of the patient infotainment system also on an output means, for example, a display, in the operating room, such that an operator can check whether the patient infotainment system is working correctly.

As already discussed, in preferred embodiments, the at least one first source means may comprise at least one camera in the examination room, in particular, configured for patient monitoring. Such cameras preferably comprise an interface using the predefined AV IP-based protocol and hence can be directly connected to the IP communication system. Via the AV/IP gateway device, monitoring information from the cameras may be displayed to connected devices, for example, transferred to a remote location, where, for example, an expert is located. Of course, if a console is directly connected to the IP communication system, the monitoring information can also be provided on the display on the console directly.

Preferably, the at least one second output and/or source means may comprise a remote expert communication device, wherein, in particular, the gateway device is configured to enable an audio and/or video call between a patient in the examination room, and/or to display audio and/or video data elements from first source means in the examination room to the remote expert.

As already discussed, the remote expert communication device may be the computing device, to which the AV/IP gateway device identifies itself as a peripheral, in particular a sound card or a webcam.

Furthermore, the at least one second source means may comprise a camera and/or a microphone directed to an operator and/or at least one person related to a patient in the examination room. This may, for example, enable direct communication, in particular in the sense of a video call, between the operator and the patient. Furthermore, a one-way communication regarding at least one person associated with the patient can be established, for example regarding pediatric patients, to whom the parents waiting in the operator room can be displayed, in particular even including audio signals. In this manner, pediatric patients can be soothed or reassured.

The disclosure also relates to a method for communicating in a magnetic resonance imaging system, in particular, according to the disclosure. The magnetic resonance imaging system comprises at least one IP communication system for communicating IP-based communication data in the magnetic resonance imaging system, at least one output means for AV data, at least one source means for AV data, and an AV/IP gateway device, the AV/IP gateway device comprising multiple non-IP interfaces for receiving AV data from source means and/or outputting AV data to output means, wherein the non-IP interfaces use at least one AV non-IP-based protocol, at least one IP interface connected to the IP communication system, the IP interface using a predefined AV IP-based protocol, and a control unit.

According to the method, the control unit converts received audio and/or video data elements between the at least one non-IP-based protocol and the IP-based protocol, outputs AV data elements converted to the IP-based protocol via the IP interface, and outputs AV data elements converted from the IP-based protocol or another non-IP-based protocol via at least one of the non-IP interfaces using the non-IP-based protocol the AV data element was converted to.

All features and remarks regarding the magnetic resonance imaging system according to the disclosure can accordingly be applied to the method according to the disclosure and vice versa, such that the same advantages can be achieved.

BRIEF DESCRIPTION OF THE DRAWINGS

Other objects and features of the present disclosure will become apparent from the following detailed description considered in conjunction with the accompanying drawings. The drawings, however, are only principle sketches designed solely for the purpose of illustration and do not limit the disclosure. The drawings show.

DETAILED DESCRIPTION

Figures 1, 2:
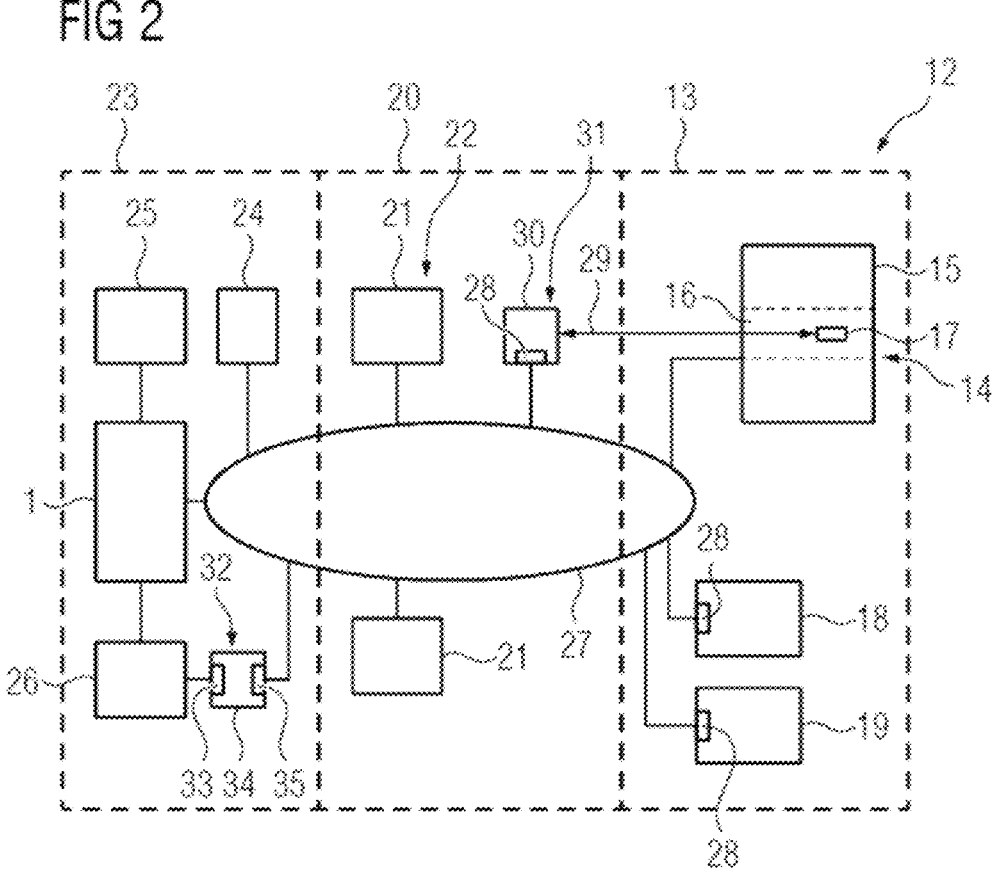
FIG. 1 illustrates a schematic functional drawing of an AV/IP gateway device for embodiments of the current disclosure.
FIG. 2 illustrates an abstract, general schematic drawing of a magnetic resonance system according to the disclosure.

FIG. 1 shows a schematic drawing of an audio and/or video/internet protocol gateway device 1 (AV/IP gateway device). In a housing 2, in addition to a power supply 3, a control unit 4 having at least one processor is provided. Multiple interfaces connected to the control unit 4 are provided in the housing 2, namely, in this embodiment, three USB interfaces 5, two HDMI input interfaces 6, two HDMI output interfaces 7, a stereo audio line in interface 8, and a stereo audio line out interface 9, an interface 10 using a proprietary protocol, and an IP interface 11. The interfaces 5, 6, 7, 8, 9, and 10 are all non-IP interfaces, meaning that they use a non-IP-based protocol. On the other hand, the IP interface 11 uses an IP-based protocol for audio and/or video data transmission, in this case, a protocol according to the ONVIF standard.

It is noted that a simplified representation has been chosen for the interfaces, which may, for example, comprise multiple connectors and/or associated further components of the gateway. For example, a codec unit may be associated with stereo audio line-in and line-out interfaces 8, 9, and/or an ETH switch may be associated with an RJ 45 and an SFP connector of the IP interface 11.

The control unit 4 is configured to convert AV data elements received via interfaces 5 to 11 between the respective protocols, in particular from one non-IP-based protocol to another non-IP-based protocol or to the IP-based protocol, and vice versa. The control unit 4 is also configured to output converted AV data elements via respective interfaces 5 to 11 matching the protocol they were converted to. In other words, AV data elements may be transferred from any receiving IP or non-IP interface 5 to 11 of the AV/IP gateway device 1 to any at least one other IP or non-IP interface 5 to 11 of the AV/IP gateway device 1.

In this embodiment, the control unit 4 is additionally configured to combine AV data elements received by different interfaces 5 to 11 of the AV/IP gateway device 1 into one combined AV data element to be output via at least one of the interfaces 5 to 11 of the AV/IP gateway device 1. For example, as combined AV data elements, picture-in-picture representations, in particular videos, and/or information overlays to pictures and/or videos or other combinations of video information may be generated. This, of course, also applies to audio information and even the combination of video and audio information, for example adding an audio track to video media elements and the like. In the context of the magnetic resonance imaging system, where the AV/IP gateway device 1 is employed, for example, information regarding the workflow and/or a current magnetic resonance imaging examination process, which is to be output visually and/or acoustically to a patient in a bore, may be added to audio and/or video entertainment information in the AV/IP gateway device 1, providing synergistic use of communication and output means by integrating audio and/or video systems. Of course, other applications are also conceivable, for example compiling AV data elements from multiple sources for a remote expert and/or an operator of the magnetic resonance imaging system.

Via at least one of the USB interfaces 5, the AV/IP gateway device 1 may also be configured to identify itself as a peripheral, in particular as a sound card or a webcam, to a computing device, in particular a personal computer (PC) and the like, connected thereto. In this manner, for example, a video conference application running on the computing device may directly use, in particular, combined, AV data elements supplied via the respective USB interface 5.

FIG. 2 shows a general, abstracted view of magnetic resonance imaging systems 12 in which the AV/IP gateway 1 is used. Generally, such magnetic resonance imaging systems 12 comprise an electromagnetically shielded (RF shielded) equipment room 13, in which a magnetic resonance imaging device 14 is located. The magnetic resonance imaging device 14 may, as in principle known, comprise a main magnet unit 15. The main magnet unit 15 may comprise a superconducting main magnet for generating the main magnetic field, a gradient coil arrangement, and a radio frequency coil arrangement, which are not shown for simplicity. The magnetic resonance imaging device defines a cylindrical bore 16 into which a patient may be introduced. To communicate with the patient, AV output and/or source means 17, for example, a patient infotainment system, may be located in the bore 16, at least during an ongoing magnetic resonance imaging examination process. Further, such first AV source means 18 and AV output means 19 may also be provided in the equipment room 13.

In an equipment room 20, further components, in particular computing devices 21 of a control arrangement 22 of the magnetic resonance imaging system 12 may be located. In an operator room 23, in this case, the AV/IP gateway device 1 is positioned for optimized accessibility, while further components may, for example, comprise at least one operator console (AV source and/or output means 24), which may also be understood as a second AV output means. Further, second AV source means 25, and AV output means 26 are shown directly connected to the AV/IP gateway device 1 via non-IP interfaces 5 to 10. Of course, any of the means 17, 18, 19, 24, 25, and 26 may also be a combined AV source and/or output means; furthermore, such means 17, 18, 19, 24, 26 may also comprise connecting means to remote locations, for example via networks, and/or storage devices. Concrete examples will be further discussed below.

Communication between different components of the magnetic resonance imaging system 12 is, in this case, enabled by an IP communication system 27, to which the AV/IP gateway device 1 is connected via IP interface 11. For example, the IP communication system 27 may comprise ethernet lines and/or WIFI means and/or at least one switch.

It is noted that first output and/or source means 17, 18, 19 for AV data in the examination room 13 may, at least partly, also be directly connected to the IP communication system 27, in particular comprising interfaces 28 configured to use the predefined AV IP-based protocol of the IP interface 11, in this case preferably the ONVIF protocol. However, in particular, if third-party patient infotainment systems are used to communicate with the patient in the bore 16, other communication links into the shielded examination room 13 may also be used, for example, wireless transmission via an RF link 29. Here, a wireless/IP gateway device 30 in the equipment room 20 or the operating room 23 may be used to convert AV data elements provided by the AV/IP gateway device 1 via the predefined AV IP-based protocol into a non-IP protocol suitable for transmission via the RF link 29. The RF link 29 and the wireless/IP gateway device 30 acting as a transceiver 31 are part of a wireless communication system of the patient infotainment system.

Already in such a generalized description, the disclosure may provide a device for transmitting audio data and/or video data into the bore 16 of the magnetic resonance imaging device 14, wherein audio data and/or video data (AV media data) are generated and/or provided to the IP communication system 27 via the AV/IP gateway device 1. The exchange of AV data from the AV/IP gateway device 1 with the wireless IP gateway device takes place via the predefined AV IP-based protocol, in particular the ONVIF protocol. From the wireless IP gateway device 30, AV data are exchanged via a proprietary wireless interface to the examination room 13, see RF link 29.

It should be noted that, generally, such magnetic resonance imaging systems may also comprise, as at least one processing device 32, a so-called third network interface card 33 (third NIC). For example, a host computer 34 may be provided in the operator room 23 having a first NIC 35 for connecting to the IP communication system 27, a second NIC (not shown in FIG. 2) for connecting to an external network, for example, a hospital IT system, and the third NIC 33 for connecting to devices from other manufacturers, for example, second AV source and/or output means 25, 26. The third NIC interface provided by the third NIC 33 in the operator room 23 can be designed as a universal interface, for example as an HDMI interface. This allows a device to be connected directly to the third NIC 33 to provide AV data. Here, also the third NIC 33 may be configured to combine AV data elements, as discussed above.

In the following, concrete embodiments illustrating use cases for the general approach shown in FIG. 2 will be discussed. In a first concrete embodiment of FIG. 3, where only some components of the magnetic resonance imaging system 12a are shown, the AV/IP gateway device 1 is again located in the operator room 23, which also comprises, as first AV source and/or output means 24, 25 and 26, the operator console (output means 24), a connector 36 to a streaming service and a computing device 37 of the patient information system. Further shown is the host computer 34 with its first NIC 35, its third NIC 33, and, in this case, also its second NIC 38. The computing device 37 is connected to the AV/IP gateway device 1 as well as to the third NIC 33. The connector 36 and the operator console (source and/or output means 24) are also shown connected to the AV/IP gateway device 1, all via non-IP interfaces 5 to 10.

In the examination room 13, the patient infotainment system also comprises a personalized patient display 39 (PPD) and a pillow 40 comprising a microphone and/or headphones and/or a loudspeaker.

The AV/IP gateway device 1 and the first NIC 35 are both connected to the IP communication system 27, which, in this case, comprises a switch 41, to which also the wireless IP gateway device 30 (transceiver 31) is connected. In this case, the wireless RF link 29 uses different frequencies for audio data (for example 2.4 GHz) and video data (for example 5 GHz), which are both higher than the magnetic resonance frequency of the magnetic resonance device 14. The antennae for transmission of the audio data and the video data can be combined, for example by means of a diplexer 42, complemented by a passive diplexer 43 in the examination room 13.

Figure 3:
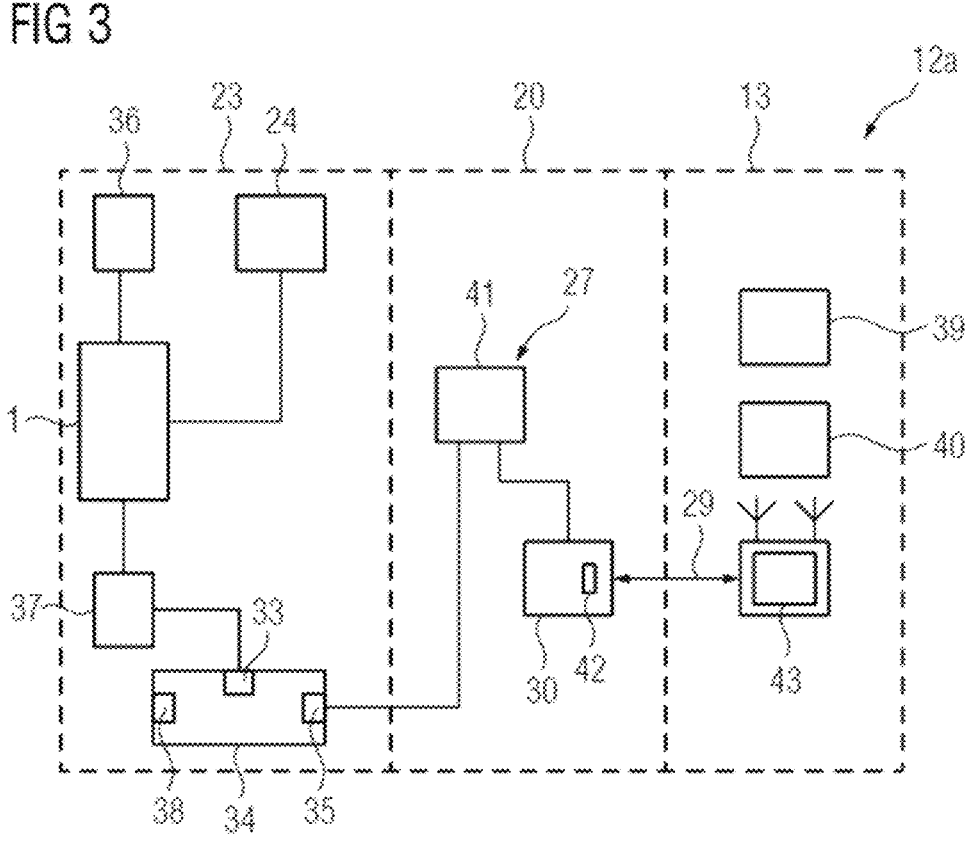
FIG. 3 illustrates a first concrete embodiment of a magnetic resonance imaging system according to the disclosure.

Here, an exemplary use case comprises the patient watching and listening to an AV stream from the connector 36 as an entertainment data element, while information regarding the workflow and/or the current examination process (information data elements) may also be provided, for example by the control arrangement 22 (not shown in FIG. 3 for simplicity). These data elements can be combined into a combined data element, for example overlaying current examination information like remaining examination time onto the entertainment video and/or overlaying optical and/or acoustical instructions, for example, breath-hold commands, onto entertainment data. It is noted that, instead of the connector 36, also a USB mass storage device of the patient may be used as source means 25. The video and audio output to the patient may, as a monitoring option, also be displayed on the operator console (source and/or output means 24) or an additional, separate display in the operator room 23.

Figure 4:
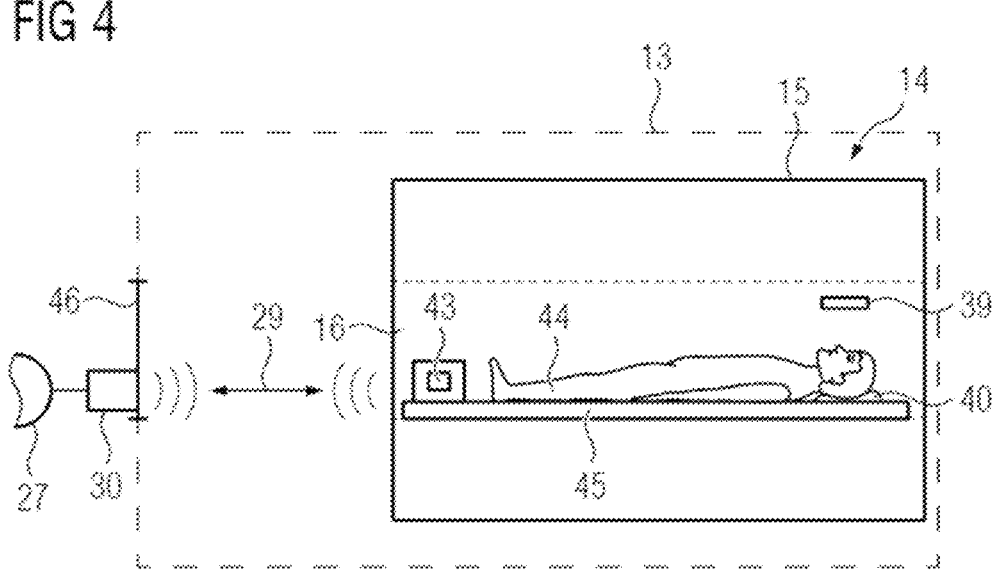
FIG. 4 illustrates a view of an examination room in the first concrete embodiment.

FIG. 4 further illustrates wireless data transmission to and from the examination room 13, where a patient 44 is shown on a patient table 45 inside the bore 16 of the main magnet unit 15. The personalized patient display 39 and the pillow 40 are also shown in the head area of the patient 44. As can be seen, in this case, the RF link 29 is provided through an RF attenuation window 46. It is noted that, in some cases, the wireless IP gateway device 30 may not be provided in the equipment room 20, but in the operator room 23.

Figures 5, 6:
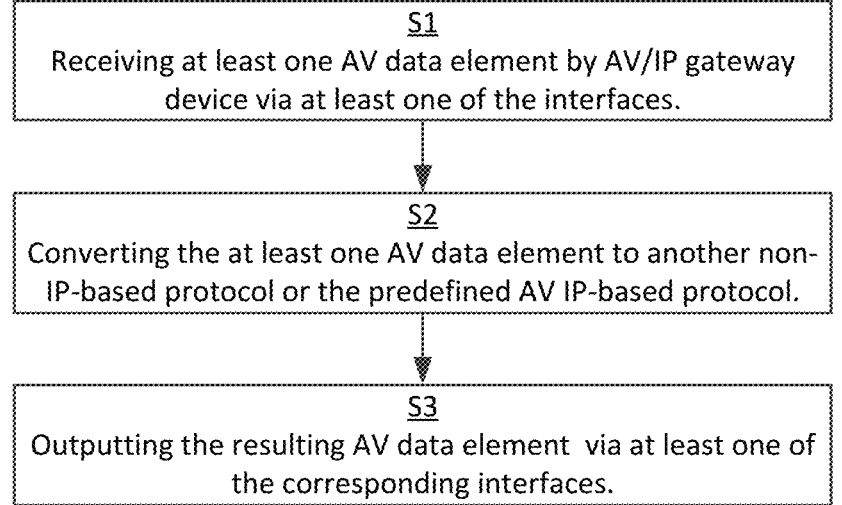
FIG. 5 illustrates a second concrete embodiment of a magnetic resonance imaging system according to the disclosure.
FIG. 6 illustrates the steps of an embodiment of a method according to the disclosure.

In FIG. 5, a second concrete embodiment suitable for including a remote expert in a magnetic resonance imaging examination process is shown. Here, in the examination room 13, cameras 47 are provided for monitoring the magnetic resonance imaging device 14 as well as the patient 44. A patient infotainment system in this case only comprises a display 48 or other optical output means, while a microphone, as well as loudspeakers and/or a headphone, are provided as AV output means and AV source means in an examination room node 49. Here, it is noted that also gradient coils of the gradient coil assembly of the magnetic resonance imaging device 14 may be used as loudspeakers. The examination room node 49 is connected to the AV/IP gateway device 1 via control device 21 of the control arrangement 22, in particular a control device 21 for providing support and/or assistance functions. The connection is established via the proprietary interface 10.

In the operator room 23, a computing device 50 acting as remote expert communication device 51 is additionally provided and connected to the AV/IP gateway device 1 via one of the USB interfaces 5. In this case, the AV/IP gateway device 1 identifies itself as a webcam and/or a sound card to the computing device 50. On the other hand, the AV/IP gateway device 1 combines data elements from the cameras 47, the control arrangement 22 (in particular information regarding the current magnetic resonance imaging examination process), and audio data from the patient 44 into a combined AV data element output to the computing device 50, where it can directly be used for participating in a video conference, for example via a video conference software running on the computing device 50 and addressing the webcam and/or sound card, in this case the AV/IP gateway device 1. In this manner, other participants of the video conference, including the remote expert and the operator, can also communicate with the patient via the loudspeakers and/or headphones of examination room node 49. Entertainment information, however, is separated from this communication and monitoring process and supplied via the display 48 and optionally additionally via the loudspeaker and/or headphones of examination room node 49.

It is noted that features of the concrete embodiments can also be combined. For example, cameras 47 and display 48 in the examination room 13 directly communicate via the IP communication system 27 and the predefined AV IP-based protocol, but may, of course, also use RF links 29. In other embodiments, examination room node 49 may also communicate directly via IP communication system 27.

Furthermore, as shown exemplarily in FIG. 5, the operator console may also comprise a camera 52 and a microphone 53, which may be directed to the operator and/or a person associated with the patient 44, for example, parents of a pediatric patient, to enable video and/or audio communication in the sense of a video from the operator room 23 to the patient 44 in the examination room 13.

FIG. 6 shows a flow chart of embodiments of a method according to the disclosure. Here, in step S1, at least one AV data element is received by AV/IP gateway device 1 via at least one of the interfaces 5 to 11.

In step S2, using the control unit 4, the at least one AV data element may be converted to a different protocol, in particular another non-IP-based protocol or the predefined AV IP-based protocol. In addition, in the case of multiple AV data elements, the control unit 4 may combine such elements into a combined AV data element.

In any case, the resulting AV data element is, in step S3, output via at least one of the corresponding interfaces 5 to 11.

Although the present disclosed subject matter has been described in detail with reference to the preferred embodiment, the present disclosure is not limited by the disclosed examples from which the skilled person is able to derive other variations without departing from the scope of the disclosure.

Independent of the grammatical term usage, individuals with male, female, or other gender identities are included within the term.

The invention claimed is:

1. A magnetic resonance imaging system, comprising:
   at least one internet protocol communication system operable to communicate internet protocol-based communication data in the magnetic resonance imaging system;
   at least one output for audio and/or video data; and
   at least one source for audio and/or video data,
   wherein the magnetic resonance imaging system further comprises an integrated audio and/or video/internet protocol gateway device comprising:
      a plurality of non-internet protocol interfaces operable to receive audio and/or video data from source and/or outputting audio and/or video data to output, wherein the non-internet protocol interfaces use at least one audio and/or video non-internet protocol-based protocol;
      at least one internet protocol interface connected to the internet protocol communication system, wherein the internet protocol interface uses a predefined audio and/or video internet protocol-based protocol; and
      a controller operable to directly convert received audio and/or video data elements between the at least one audio and/or video non-internet protocol-based protocol and the internet protocol-based protocol, wherein the controller performs protocol conversion between different protocol formats within the integrated gateway device, output audio and/or video data elements converted to the internet protocol-based protocol via the internet protocol interface, and output audio and/or video data elements converted from the internet protocol-based protocol or another non-internet protocol-based protocol via at least one of the non-internet protocol interfaces using the non-internet protocol-based protocol the audio and/or video data element was converted to.

2. The magnetic resonance imaging system according to claim 1, wherein the controller is additionally operable to combine audio and/or video data elements received by different interfaces of the audio and/or video/internet protocol gateway device into one combined audio and/or video data element to be output via at least one of the interfaces of the audio and/or video/internet protocol gateway device.

3. The magnetic resonance imaging system according to claim 1, further comprising:
   at least one processing device operable to combine audio and/or video data elements received via the internet protocol communication system.

4. The magnetic resonance imaging system according to claim 3, further comprising:
   a control arrangement, wherein the audio and/or video/internet protocol gateway device and/or the processing device is operable to combine an information data element from the control arrangement with at least one entertainment data element.

5. The magnetic resonance imaging system according to claim 1, wherein the non-internet protocol interfaces are at least partly chosen from a group consisting of: a USB interface, an HDMI interface, a stereo audio line in and/or out interface, and at least one non-internet protocol interface using a proprietary protocol.

6. The magnetic resonance imaging system according to claim 1, further comprising:
   at least one computing device to which the audio and/or video/internet protocol gateway device is connected via at least one of its non-internet protocol interfaces, wherein the audio and/or video/internet protocol gateway device is configured to identify itself as a multimedia peripheral to the computing device.

7. The magnetic resonance imaging system according to claim 1, further comprising:
   at least partly in a shielded examination room, a magnetic resonance imaging device, and at least one first output for audio and/or video data and/or at least one first source for audio and/or video data, and
   in an operator room, at least one second output for audio and/or video data and/or at least one second source for audio and/or video data,
   wherein the audio and/or video/internet protocol gateway device is located in the operator room.

8. The magnetic resonance imaging system according to claim 7, wherein at least one of the at least one first output and/or source is connected to the internet protocol communication system via interfaces using the predefined audio and/or video internet protocol-based protocol.

9. The magnetic resonance imaging system according to claim 7, wherein the at least one first output and/or source comprises a patient infotainment system, the patient infotainment system comprising at least one display and/or at least one headphone and/or at least one loudspeaker and/or at least one microphone.

10. The magnetic resonance imaging system according to claim 9, wherein the patient infotainment system further comprises a wireless communication system having at least one transceiver located outside of the examination room and being connected to the internet protocol communication system via an interface using the predefined audio and/or video internet protocol-based protocol.

11. The magnetic resonance imaging system according to claim 7, wherein the at least one first source comprises at least one camera in the examination room operable for patient monitoring.

12. The magnetic resonance imaging system according to claim 7, wherein the at least one second output and/or source comprises a remote expert communication device, wherein, the audio and/or video/internet protocol gateway device is configured to enable an audio and/or video call between a patient in the examination room and/or to send audio and/or video data elements from first source in the examination room for display to the remote expert.

13. The magnetic resonance image system according to claim 7, wherein the at least one second source comprises a camera and/or a microphone directed to an operator and/or at least one person related to a patient in the examination room.

14. The magnetic resonance imaging system according to claim 1, wherein the internet protocol-based protocol comprises or is an ONVIF protocol.

15. A method for communicating in a magnetic resonance imaging system including at least one internet protocol communication system operable to communicate internet protocol-based communication data in the magnetic resonance imaging system, at least one output for audio and/or video data, at least one source for audio and/or video data, and an integrated audio and/or video/internet protocol gateway device having a plurality of non-internet protocol interfaces for receiving audio and/or video data from source and/or outputting audio and/or video data to output, wherein the non-internet protocol interfaces use at least one audio and/or video non-internet protocol-based protocol, at least one internet protocol interface connected to the internet protocol communication system, the internet protocol interface using a predefined audio and/or video internet protocol-based protocol, and a controller for performing the method, the method comprising:

directly converting received audio and/or video data elements between the at least one audio and/or video non-internet protocol-based protocol and the internet protocol-based protocol, wherein the controller performs protocol conversion between different protocol formats within the integrated gateway device;

outputting audio and/or video data elements converted to the internet protocol-based protocol via the internet protocol interface; and outputting audio and/or video data elements converted from the internet protocol-based protocol or another non-internet protocol-based protocol via at least one of the non-internet protocol interfaces using the non-internet protocol-based protocol the audio and/or video data element was converted to.

* * * * *